(12) United States Patent  (10) Patent No.: US 8,866,519 B1
Hiebert  (45) Date of Patent: Oct. 21, 2014

(54) SYSTEM AND METHOD FOR REDUCING SPECTRAL POLLUTION IN A SIGNAL

(71) Applicant: PMC-Sierra US, Inc., Sunnyvale, CA (US)

(72) Inventor: Mark Hiebert, New Westminster (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/781,100

(22) Filed: Feb. 28, 2013

(51) Int. Cl.
*H03L 7/06* (2006.01)
*H03L 7/08* (2006.01)

(52) U.S. Cl.
CPC .................................. *H03L 7/08* (2013.01)
USPC ............................................ 327/156; 327/147

(58) Field of Classification Search
USPC ................................................. 327/147, 156
See application file for complete search history.

(56) References Cited

U.S. PATENT DOCUMENTS

| | | |
|---|---|---|
| 6,774,740 B1 | 8/2004 | Groe |
| 6,985,708 B2 | 1/2006 | Lin et al. |
| 7,082,176 B2 | 7/2006 | Chien et al. |
| 7,382,849 B1 | 6/2008 | Groe et al. |
| 7,449,960 B2 | 11/2008 | Bunch et al. |
| 7,653,359 B2 | 1/2010 | Darabi |
| 7,864,707 B2 | 1/2011 | Dimitropoulos et al. |
| 7,999,622 B2 | 8/2011 | Galton et al. |
| 2001/0052822 A1* | 12/2001 | Kim et al. ............ 331/8 |
| 2009/0072913 A1* | 3/2009 | Eikenbroek ........... 331/18 |
| 2012/0074995 A1 | 3/2012 | Zhang |
| 2014/0077841 A1* | 3/2014 | Jia et al. ............... 327/3 |

* cited by examiner

*Primary Examiner* — Adam Houston
(74) *Attorney, Agent, or Firm* — Dennis R. Haszko (57) ABSTRACT

A system and a method for modulating an input signal are provided. The system includes a fractional-N phase locked loop (PLL) for frequency multiplying the input signal by a multiplication factor to generate an output signal. The fractional-N PLL includes an input signal path and a feedback signal path. The system includes a controllable delay line for inserting a linearizing tone into the input signal path or the feedback signal path of the fractional-N PLL.

24 Claims, 10 Drawing Sheets

SYSTEM AND METHOD FOR REDUCING SPECTRAL POLLUTION IN A SIGNAL

FIELD

The present disclosure relates generally to a method and an apparatus for reducing spectral pollution in a signal. More particularly, the present disclosure relates to a fractional-N phase locked loop (PLL).

BACKGROUND

High performance fractional-N PLLs are commonly employed in wireless transceiver applications to drive clocks into transmit and receive RF mixers. These PLLs generate flexible frequency low phase noise RF clocks with low spurious content through fractional-N PLL multiplication of a lower frequency reference clock. These PLLs are termed "fractional-N" because they are capable of generating output frequencies through frequency multiplication of a reference frequency signal, and a multiplication factor (N) can take both integer values and non-integer or fractional values.

Wireless transceivers, particularly in cellular or mobile RF applications, are often highly sensitive to spectral pollution (or spurious content) on their RF clock signals. If there is unwanted spurious content in the RF clock signal, the spurious content will cause spectral pollution of the mixer output signal. Because RF transceivers typically operate on a set of pre-defined RF frequencies or channels, these fractional-N PLLs typically need to be capable of generating a specific set of pre-defined RF clock frequencies with regular spacing (commonly 100 kHz). Each RF clock frequency must have minimal spectral pollution, including at offsets as low as 100 kHz, because, for example, content on the RF clock signal at 100 kHz causes unwanted interaction in the signal path between content on neighboring channels (channels that are separated by 100 kHz spacing).

A common challenge in RF clock generation is that for specific RF channels, the RF clock generated from a fractional-N PLL has unacceptable spectral pollution. The problematic RF clock frequencies are frequencies where the RF clock frequency is very close to an integer multiple of the reference clock frequency. Numerous effects in a highly integrated device could cause poor behavior in these scenarios. For example, when an voltage controlled oscillator built using a parallel inductance-capacitance resonant circuit (LC VCO) is tuned by a fractional-N PLL loop to resonate near to an integer multiple of the reference clock, it is possible for harmonics of the reference clock switching activity (present inside the integrated device) to cause ripple or movement in shared power or ground connections. The VCO circuit is uniquely sensitive to the harmonic frequency of the reference clock that is very close to the VCO's resonant frequency. Coupling directly into the VCO of this particular reference clock harmonic can cause spectral pollution for these specific configurations.

Conventional ways of mitigating spectral pollution include ensuring VCO isolation in relation to reference switching circuitry, using dedicated power domains and large spacing between circuits. This increases cost in a highly integrated circuit.

Another cause of problematic behavior for this type of RF clock frequency configuration is that the inherent quantization noise of delta sigma modulator (DSM) fractional-N phase modulation sequence can be unacceptably high. For near-integer configurations it is possible for the inherent quantization noise of a non-randomized DSM to have too much power concentrated at a specific low offset frequency (for example, where the PLL's low pass characteristic will not provide attenuation). To mitigate this, the DSM architecture is chosen such that this effect is at an acceptable level. Typically a higher order DSM is employed to ensure that the inherent quantization noise in the DSM output signal is sufficiently minimized at lower frequencies where the PLL provides minimal filtering.

An additional concern with conventional systems is the non-linear nature of the PLL's phase detection and charge pump circuitry. The choice of higher order DSMs in conventional systems may reduce the power in low frequency quantization noise, but also increases the power in higher frequency harmonics of the repetitive quantization noise sequence generated by the DSM activity. Before the PLL can perform its low-pass characteristic on DSM quantization noise, the quantization noise signal must pass through the non-linear phase detection and charge pump response. This non-linearity introduces folding of the quantization noise (also known as intermodulation) where some of this intermodulation power will fall at lower frequencies. Intermodulation falling at low frequencies will experience little or no filtering by the PLL's low pass characteristic.

Conventional strategies for mitigating the non-linear characteristic of the phase detection and charge pump circuitry include introducing a static phase shift between the arrival of the reference clock and feedback clock at steady state. This static phase shift can be performed, for example, in a charge pump PLL by introducing an offset current into the loop filter. Conventional techniques generally introduce some noise (due to noise of the offset current or the additional noise injected during the offset-correcting current pulse) and also introduce a single frequency phase modulation tone at the reference clock rate due to the loop filter ripple associated with this activity.

Alternatively, significant conventional system efforts can be taken to match and balance the up and down currents in the charge pump and significant system effort can be made to provide isolation between the switching currents associated with the arrival of feedback clock edges and reference clock edges in an attempt to ensure that the phase detection circuit and charge pumping activity is maximally linear both near the zero phase offset point and at larger positive and negative phase differences. Optimizing these characteristics is a standard part of appropriate fractional-N PLL circuit design efforts. Even with best efforts to achieve sufficient linearity, non-idealities remain in conventional circuits that introduce non-linearity. In stringent applications, it may be challenging to achieve the necessary linearity performance through circuit design efforts alone.

Efforts can be taken to randomize or whiten the quantization noise spectrum from the DSM. These activities can help to avoid the quantization noise from folding through the non-linearity to create power in a concentrated set of intermodulation tones in low frequency bins. Whether the quantization noise generated by the DSM is repetitive (i.e. made up of many discrete tones) or whitened (i.e. spread smoothly across a range of frequencies), the quantization noise will experience intermodulation in both cases and produce some significant power at low offset frequencies where the PLL provides minimal attenuation.

Conventional high-performance fractional-N RF clock generators that target applications with stringent restrictions on spurious pollution of RF clock signals (e.g. cellular/mobile RF transceivers) typically employ brute force approaches to solving high spurious content for near-integer multiplier Fractional-N PLL configurations. System effort is employed in order to produce optimally linear PLL circuits (with most effort being required in phase detector and charge pump design). Also additional circuit techniques are often enabled when the device must operate at these frequencies, which allow spurious content to be reduced but often along with significant additional clock signal impairments (such as significant additional phase noise due to the broadband dithering activity used to break up fractional-N tonal behavior). Conventional broadband dithering techniques employ rational fractions as frequency for PLLs across many frequencies and add other content to the reference frequency. Where broadband tones are dithered across a range of frequencies the tone often mixes with itself and is not well filtered. This smearing of the input signal creates an intermodulation affect which causes further problems with using the signal.

In certain cases, users of conventional devices may simply choose to accept that performance is unacceptable in these near-integer frequencies and spend resources elsewhere in the RF transceiver to make up for the fact that the RF clock is unable to operate with acceptable performance at certain frequencies.

It is desirable to find alternative ways to reduce high spurious content occurring in near-integer multiplier PLL configurations using methods that reduce the negative impacts of the existing approaches. It is, therefore, desirable to provide a method and an apparatus for reducing spectral pollution.

BRIEF DESCRIPTION OF THE DRAWINGS

Embodiments of the present disclosure will now be described, by way of example only, with reference to the attached Figures.

DETAILED DESCRIPTION

Generally, the present disclosure provides a method and system for reducing spectral pollution in a signal. According to an embodiment, a method and apparatus for reducing spectral pollution of fractional-N PLLs uses a tonal phase modulation sequence to linearize the phase response characteristic of critical PLL circuitry.

Fractional-N RF clock generator PLL systems described in this disclosure seeks to improve spurious performance of fractional-N PLLs in near-integer configurations.

In a first aspect, the present disclosure provides a system for modulating an input signal. The system includes a fractional-N phase locked loop (PLL) for frequency multiplying the input signal by a multiplication factor to generate an output signal, the fractional-N PLL includes an input signal path and a feedback signal path, and a controllable delay line for inserting a linearizing tone into the input signal path or the feedback signal path of the fractional-N PLL.

In a further embodiment, there is provided a method for modulating an input signal. The method includes frequency multiplying, using a fractional-N phase locked loop (PLL), the input signal by a multiplication factor to generate an output signal, the fractional-N PLL includes an input signal path and a feedback signal path, and inserting a linearizing tone into the input signal path or the feedback signal path of the fractional-N PLL.

In an aspect, a frequency of the linearizing tone is unrelated to a quantization noise repetition frequency of the fractional-N PLL.

In an aspect, the fractional-N PLL includes a phase detector and a charge pump, and wherein the linearizing tone is selected such that a phase detector and charge pump transfer function of the fractional-N PLL is linearized over a time scale near or below an inherent low pass time constant of the fractional-N PLL.

In an aspect, the linearizing tone includes a signal having a frequency at least ten times a bandwidth of the fractional-N PLL.

In an aspect, the linearizing tone includes a plurality of tonal phase modulation signals and wherein each of the plurality of tonal phase modulation signals has a unique frequency. The plurality of tonal phase modulation signals avoid intermodulation below a low pass bandwidth of the fractional-N PLL.

In an aspect, a frequency and amplitude of the linearizing tone is optimized for a fraction value of the fractional-N PLL.

In an aspect, a multi-modulus divider actuates the controllable delay line in the feedback signal path of the fractional-N PLL. The multi-modulus divider produces the linearizing tone, and the linearizing tone is superimposed on an underlying fractional-N phase modulation signal of the fractional-N PLL.

In an aspect, a modulated analog delay or a modulated digital delay controls the controllable delay line.

In a further aspect, the linearizing tone includes a simple tone with a frequency equal to half of a frequency of the input signal.

In an aspect, the linearizing tone includes equal magnitude positive and negative phase offsets for alternating input signal cycles.

In a further aspect, the method includes optimizing a frequency and amplitude of the linearizing tone for a fraction value of the fractional-N PLL.

In an aspect, the method includes actuating a multi-modulus divider in the feedback signal path of the fractional-N PLL to produce the linearizing tone.

In an aspect, the method includes superimposing the linearizing tone on an underlying fractional-N phase modulation signal of the fractional-N PLL.

In a further aspect, the method includes controlling a modulated analog or a modulated digital delay to produce the linearizing tone.

Other aspects and features of the present disclosure will become apparent to those ordinarily skilled in the art upon review of the following description of specific embodiments in conjunction with the accompanying figures.

Embodiments presented herein illustrate a system and method for linearizing phase response of PLL circuitry as experienced by fractional-N phase modulation sequences through adding an unrelated-frequency tonal phase modulation to the feedback clock to linearize critical portions of the PLL circuitry. High frequency clock generation applications, particularly in RF or wireless communication systems, often employ fractional-N PLLs to multiply up from a reference clock to a specific set of RF clock frequencies. In RF communications systems, a specific set of clock frequencies is mapped to a specific set of RF channels and these RF clocks typically have stringent spectral purity requirements. In these applications, certain clock frequencies have unique challenges with respect to spurious performance. For example, if the output clock frequency is very close to an integer-multiple of the reference frequency, then it is common for the fractional-N PLL to generate large spurious content on the output clock at multiples of the spacing between the output frequency and the integer-multiple of the reference frequency. There are a number of different effects in fractional-N PLLs that cause this degraded performance unique to these certain output frequencies. An effect is that quantization noise of a fractional-N Delta Sigma feedback path is passed through non-linear circuit responses in the PLL which causes intermodulation of the quantization noise signal. In near-integer multiplier fractional-N configurations the frequency content of the quantization noise allows some intermodulation products to fall, concentrated at specific low offset frequencies where they are not well-filtered by the PLL's low-bandwidth characteristic.

Embodiments of the present disclosure present a system having an architecture that uses a tonal phase modulation signal, which is added to the fractional-N quantization noise phase modulation sequence, to effectively linearize the phase response of the PLL circuits as seen by the fractional-N quantization noise over longer time scales (i.e. time scales longer than the PLLs phase tracking time constant).

The architecture of systems according to embodiments of the present disclosure is relevant to the practical implementation of high performance RF clock generators. Conventional systems use significant area, power, and design optimization efforts to minimize PLL nonlinearities, which adds to the design costs and reduces competitiveness of the system. If performance is not acceptable despite these efforts, certain RF channels will need to either be unsupported by systems (because their corresponding RF clock frequencies have unacceptable spectral pollution), or other compromises must be made in the system application space that reduces the value of the RF communication system.

Embodiments of the present disclosure relate to a fractional-N PLL that generates a flexible range of output clock signals while maintaining low spectral pollution of the output clock signal. Embodiments may be particularly suited for radio frequency (RF) clock generators in wireless infrastructure applications (such as wireless base-stations) where output clock spectral purity requirements are particularly stringent. They are also applicable to mobile side RF transceivers in cellular and other wireless communications as well as other wired or optical communications applications where clock spectral purity is a concern and where clocks are generated using fractional-N PLL structures.

Figure 1:
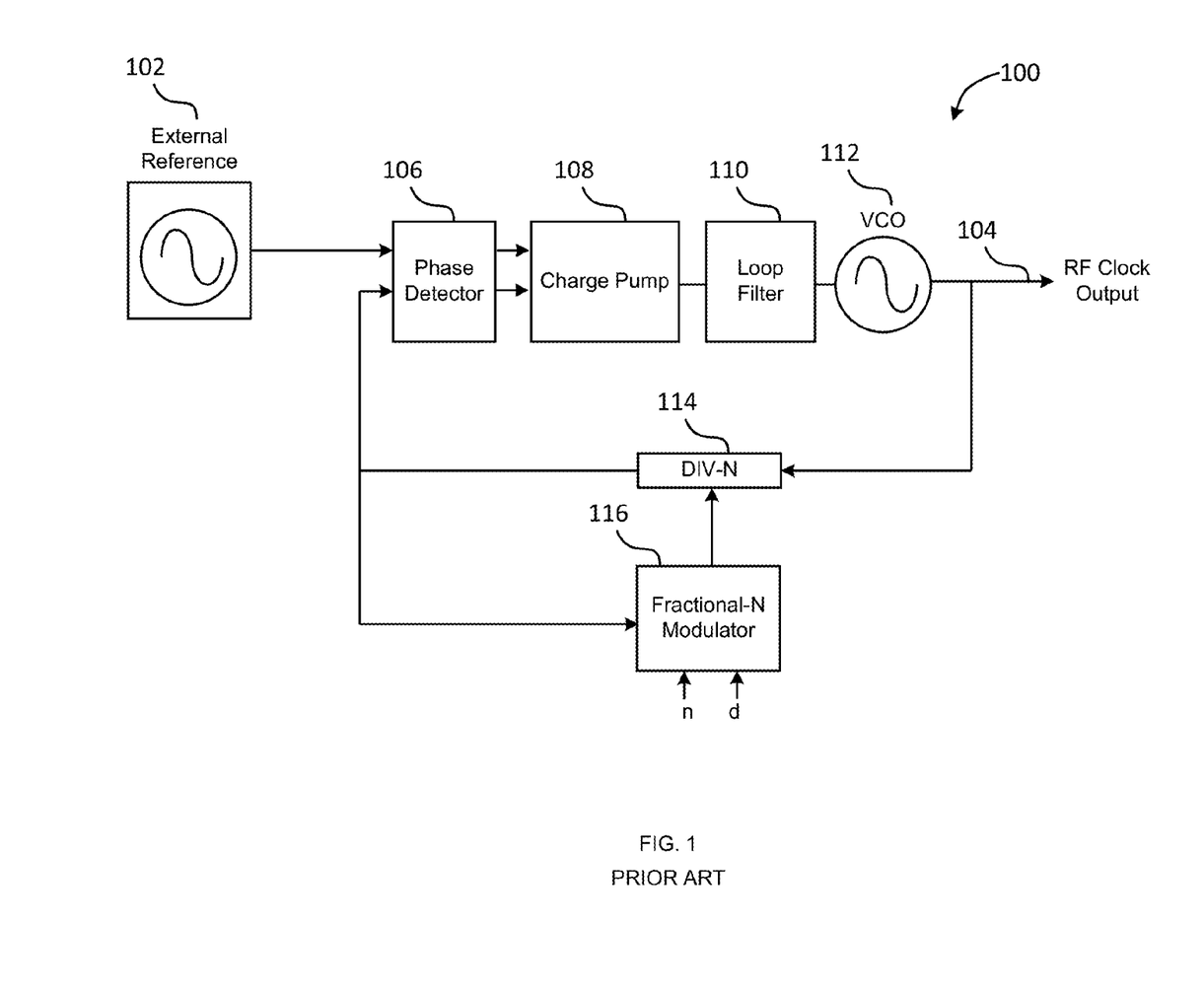
FIG. 1 is a block diagram of a fractional-N phase locked loop.

FIG. 1 illustrates a typical fractional-N PLL 100. An input reference frequency 102 is fed into the fractional-N PLL 100 and an output frequency 104 is generated. The fractional-N PLL 100 includes a phase/frequency detector 106, a charge pump 108, a low pass loop filter 110, a controlled oscillator (e.g. a voltage-controlled oscillator (VCO)) 112, a feedback divider 114, and a fractional-N modulator 116. The feedback divider 114 is controlled and is modulated by the fractional-N modulator 116 such that the feedback divider 114 can divide by X, where X is an integer that may change between successive divide cycles. The fractional-N modulator 116 can be a digital state machine that generates a long-term average feedback mean(X)=divider ratio selected by an additional control, typically a rational fraction of two typically large integers: numerator n and denominator d, such that mean(X)=n/d. The illustrated fractional-N modulator uses an output of the feedback divider 114 for clocking of the state machine; however, other configurations are possible.

Ideally, a transfer function that converts a phase error p(t) to a current magnitude at the charge pump 108 output i(t) would be perfectly linear. For example, ideally the phase detector 106 and charge pump 108 in a charge pump PLL would provide a perfectly linear transfer function where the input phase signal and output current signal are related by a constant k, such that the charge pump output frequency is represented as $$i(t)=k*p(t).$$

However, any realistic phase detector 106 and charge pump 108 would experience some non-linearity (such as nonlinear characteristics of the phase detection and charge pump). For example, where the non-idealities of the phase detector 106 and charge pump 108 are modeled as a second order non-linearity for small phase errors, then the charge pump output is represented as:

$$i(t)=k*(p(t)+a_2 p(t)^2)$$

When a multi-tonal phase modulation sequence is passed through a transfer function with non-linear characteristics, intermodulation between the different frequency content of the input signal occurs. For example, if a two tone signal experiences a 2nd order non-linearity described above, the following output signal and unwanted intermodulation products will be generated:

$$p(t) = a_0 \sin(2\pi f_0 t) + a_1 \sin(2\pi f_1 t)$$

$$i(t) = k \Big[ a_0 \sin(2\pi f_0 t) + a_1 \sin(2\pi f_1 t) + a_2 \frac{a_0 a_1}{2} (\sin(2\pi (f_0 - f_1)t) - (\sin(2\pi (f_0 + f_1)t)) + a_2 a_0^2 \sin(2\pi (2f_0)t) + a_2 a_1^2 \sin(2\pi (2f_1)t) \Big]$$

Due to the properties of the sinusoidal functions involved, resulting intermodulation products in the output signal i(t) fall at frequencies equal to sums or differences of the two frequencies that were present in the input signal p(t) for the case where a simple second order nonlinearity is present. This behavior holds true when a multi-tonal signal is passed through a nonlinear transfer characteristic when moving to higher order nonlinear systems. Output frequency content falls at frequencies that are sums and/or differences of some number of the frequencies that make up the input signal.

This characteristic is particularly relevant to the creation of spectral pollution. The phase modulation sequence is generated due to the quantization noise of a fractional-N PLL being repetitive. As the quantization noise is repetitive, frequency content of the signal falls at integer multiples of the repetition frequency. The signal is made up of a series of quantization noise tones. When this type of signal experiences intermodulation, the intermodulation effects will also all fall at integer multiples of the repetition frequency. This effect tends to undo the benefits of choosing a higher order delta sigma modulator (DSM). Higher order DSMs are chosen so that the quantization noise that falls at lower frequencies (such as the first, second, and third harmonic of the repetition frequency) are specifically minimized with a tradeoff that significant additional quantization noise is generated at higher frequencies. When this higher order DSM experiences intermodulation, the higher frequency tones intermodulate with their close-by neighbor tones and these intermodulation products then fall at low frequencies like the first, second, and third harmonic of the repetition frequency.

Figure 2:
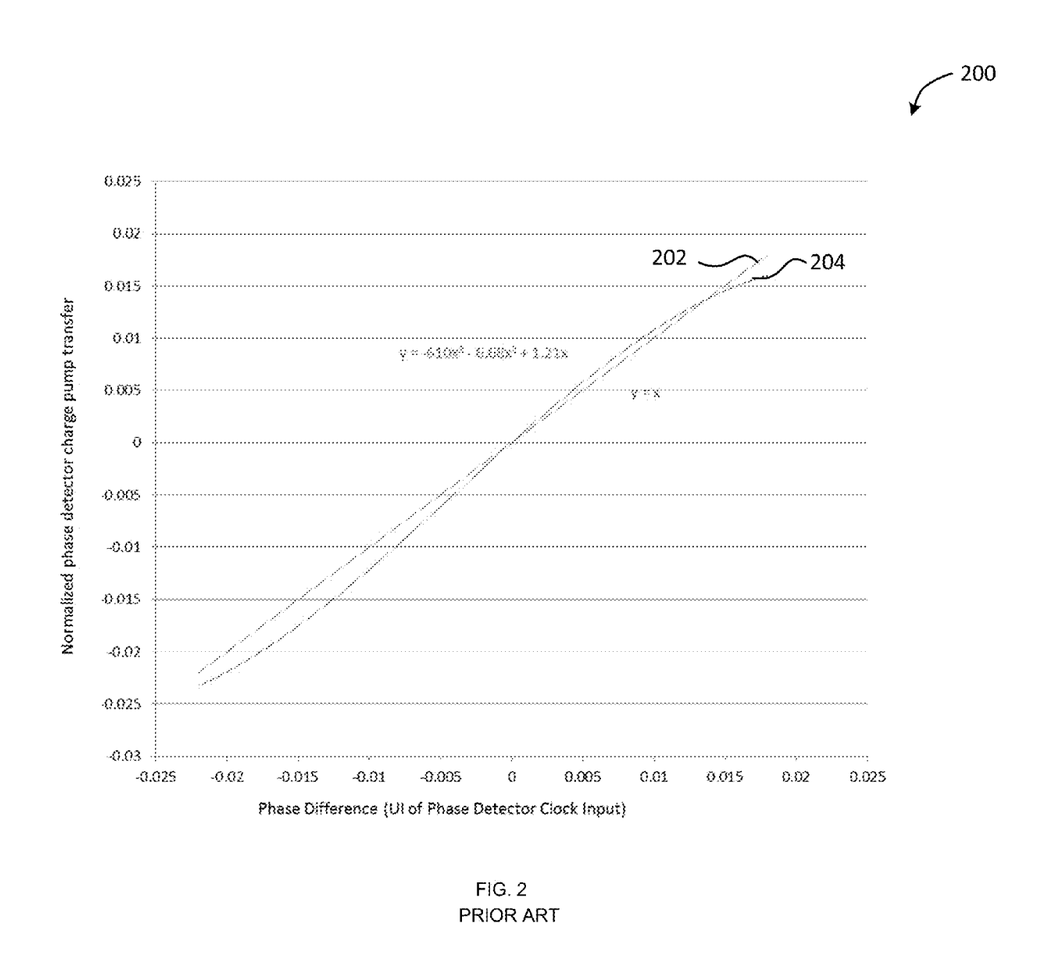
FIG. 2 is a graph of transfer functions for a phase locked loop circuit.

FIG. 2 illustrates a graph 200 of a linear PLL circuit normalized transfer function 202 and a nonlinear 204 PLL circuit normalized transfer function. The equation for the linear transfer function 202 is y=x and the equation for the nonlinear transfer function 204 in the example of FIG. 2 is y=−610x^3− 6.68x^2+1.21x. The linear transfer function 202 is produced by an ideally linear phase detection and charge pump circuit. The nonlinear transfer function 204 is produced by an example non-linear response. The nonlinear response 204 has both second order and third order nonlinearity terms.

The example nonlinear phase detection response includes some minor mismatch between large up and down current signals, but typically the most impactful non-linear characteristic is the disturbances in the transfer characteristic near a zero phase offset. The disturbances near the zero phase offset are typically dominated by coupling between the reference clock edge detection circuits and the feedback clock edge detection circuits (e.g. through common power supply nodes); this effect typically causes unique and challenging non-linear behavior that impacts the behavior of the PLL particularly during instances of small phase offsets.

Figure 3:
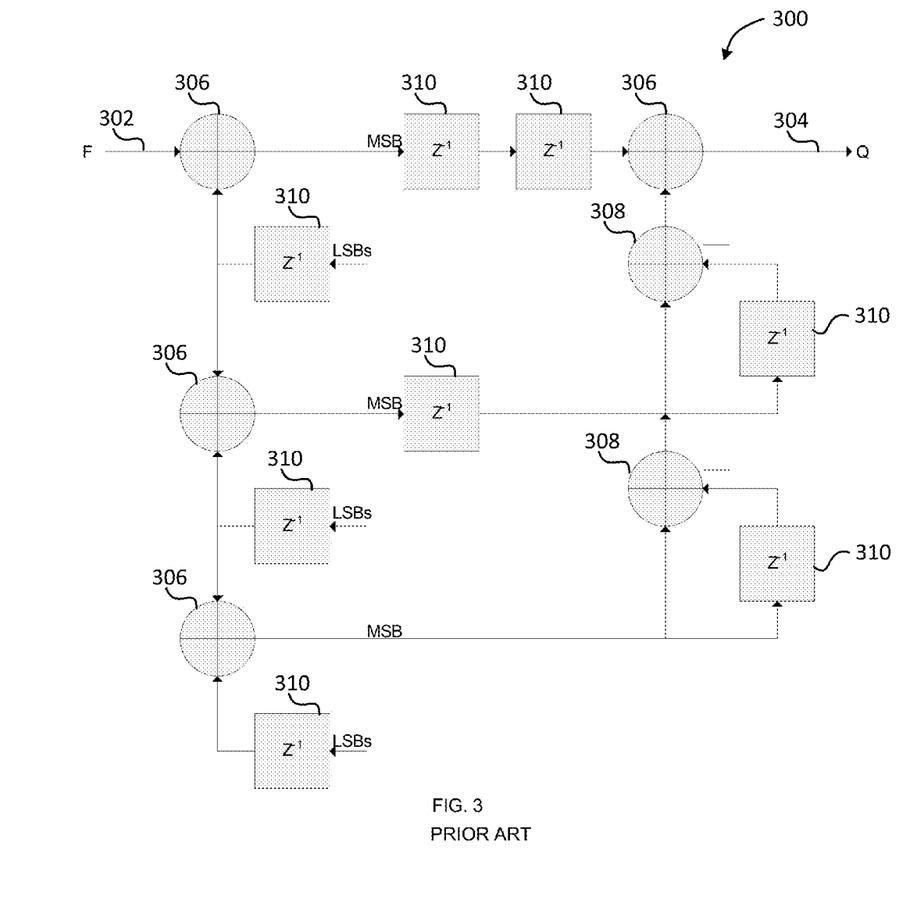
FIG. 3 is a block diagram of a MASH 1-1-1 delta-sigma modulator.

FIG. 3 illustrates a MASH 1-1-1 delta-sigma modulator (DSM) 300, in accordance with an embodiment. The DSM 300 is a fundamental building block of fractional-N PLLs. The DSM 300 has an input frequency (F) 302, and an output frequency (Q) 304. The DSM 300 uses summers 306 and subtractors 308 with delay elements 310 to shape quantization noise. The quantization noise represents the difference between the ideal phase ramp of the feedback clock (where the feedback clock cycle advances 1 UI of phase over a non-integer number of VCO cycles) and the actual phase ramp of the feedback clock as controlled by the discrete Divide-by-N feedback divider, which causes the feedback phase to ramp through 1 UI of phase over an integer number of cycles (N). The value of N is adjusted for every feedback clock cycle so that on average the feedback cycles require the correct "fractional-N" number of VCO periods for every feedback clock cycle that is completed. The difference between an ideal fractional-N feedback circuit and the actual modulated discrete sequence of Divide-by-N is the cause of a quantization noise effect in the PLL, where this noise generates a repetitive phase modulation detected by the phase detection circuits of a fractional-N PLL.

By choosing a higher order DSM, the quantization noise can be shaped as much as needed into higher frequency regions where additional PLL filtering will occur.

The DSM 300 produces repetitive output signals when driven with a static fractional value which produces a tonal output quantization noise spectrum. In RF clock generation applications, the DSM 300 may have fairly simple rational fractions, because the needed channel spacing (often 100 kHz) is commonly a direct divisor of the reference frequency (e.g. 153.6 MHz is a common reference clock frequency in wireless infrastructure RF clock generation applications, the delta sigma modulator fractional will always be representable as N/1536 to generate an output frequency step size of 100 kHz).

In alternative embodiments, MASH 1-1-1 DSM concepts are applied to other DSMs.

Figure 4:
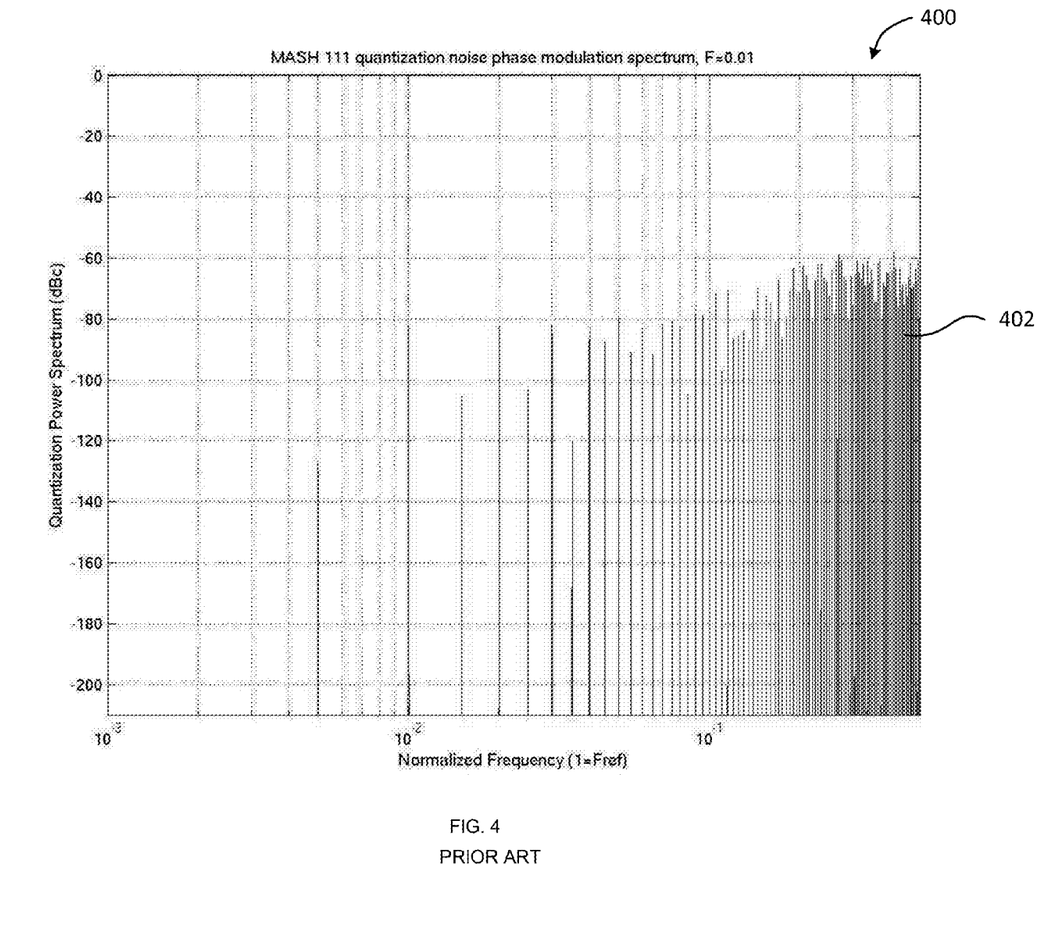
FIG. 4 is a graph of quantization noise phase modulation for a MASH 1-1-1 delta sigma modulator.

FIG. 4 illustrates a graph 400 of quantization noise phase modulation for a MASH 1-1-1 DSM where F=0.01. The graph 400 illustrates spectral content 402 of the fractional-N quantization noise phase modulation sequence for a simple rational fraction (F=1/100) for a fractional-N PLL using a third order MASH 1-1-1 delta sigma modulator. The spectral content has multi-tonal frequency content in the signal. The lowest frequency content is the product of the fraction (F=1/100) and the reference frequency divided by two. The other tones are multiples of this base frequency for this particular DSM structure.

The multi-tonal quantization noise phase modulation, p(t), generated by a MASH 1-1-1 fractional-N PLL with a fractional value F can be represented as a Fourier series:

$$p(t) = \sum_{n=1}^{f_{ref}/F} (a_n \sin(n\pi f_{ref} t * F + \theta_n))$$

Figure 5:
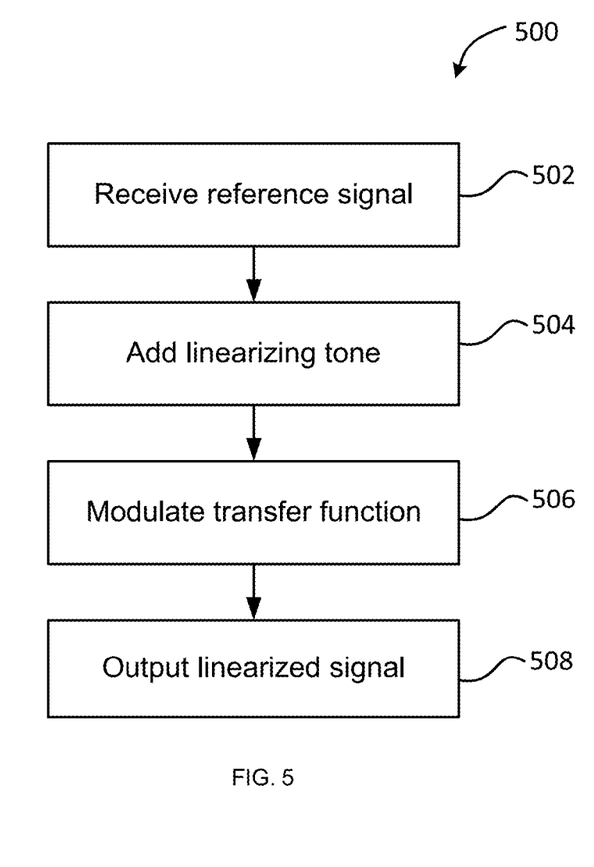
FIG. 5 is a flow diagram of a method for reducing spectral pollution, in accordance with an embodiment.

The quantization noise shown in FIG. 5 experiences intermodulation and folding in a nonlinear transfer characteristic in the phase detection and charge pump circuits of a PLL.

The example nonlinear response 204 of FIG. 2, when plotted to produce shaped DSM quantization noise through a PLL, is similar to FIG. 4 except with significant amplification of low frequency power due to intermodulation effects.

Intermodulation effects are quite large especially for low frequency intermodulation products. The low pass characteristic of the PLL is able to effectively attenuate the higher frequency content, but the intermodulation terms that fall at low frequencies will be passed to the RF output clock spectrum with minimal or no attenuation.

Intermodulation products that are problematic occur at very low frequencies relative to the reference clock frequency. The phase response of the phase detection and charge pump circuit may need to have a static non-linear characteristic over a fairly large number of reference clock cycles in order to allow the low frequency intermodulation product to be generated. Modulating or adjusting the transfer function of the phase detection and charge pump circuit over this long time period would impact the magnitude of the low frequency intermodulation product because the time-averaged circuit response would be more linear as seen over this time period.

Low frequency intermodulation products fall at low frequencies, near or below the PLL bandwidth. The intermodulation products that fall at these lower frequencies are not filtered by the PLL's low pass characteristic because they are slow enough for the PLL to track them easily. However, the long time scales involved in these intermodulation products also mean that they are generated based on the average phase detector and charge pump transfer function over this large time period. If the phase detector and charge pump transfer function is partially linearized, as seen averaged over the time scale of a low frequency intermodulation cycle, the intermodulation product may be reduced.

In an embodiment, an additional phase modulation signal for linearization is a high frequency phase modulation. The high frequency of the linearization phase modulation would ensure that the linearization signal experiences significant filtering by the PLL's low pass characteristic so it is not passed to the output.

FIG. 5 illustrates a flow chart of a method 500 for reducing spectral pollution in a fractional-N PLL, in accordance with an embodiment. At 502, an input reference signal is received by a fractional-N PLL.

At 504, a linearizing tone is inserted into an input signal path or a feedback signal path of the fractional-N PLL. For example, a non-related high frequency tonal linearization signal is added to a quantization noise phase modulation DSM.

At 506, the reference signal is frequency multiplied by the fractional-N PLL and the linearization signal modulates a phase detector and charge pump transfer function of the fractional-N PLL. The modulation of the transfer function of the phase detector and charge pump may occur over time periods near or longer than the PLL's reference phase tracking time constant.

At 508, the circuitry's response is effectively linearized, as averaged over a time period of the lowest frequency intermodulation cycles, and a linearized signal is output. To reduce spectral pollution, the multi-tonal fractional-N phase modulation sequence experiences a linearized PLL phase response as averaged over time periods longer than the PLL's time constant.

Figure 6:
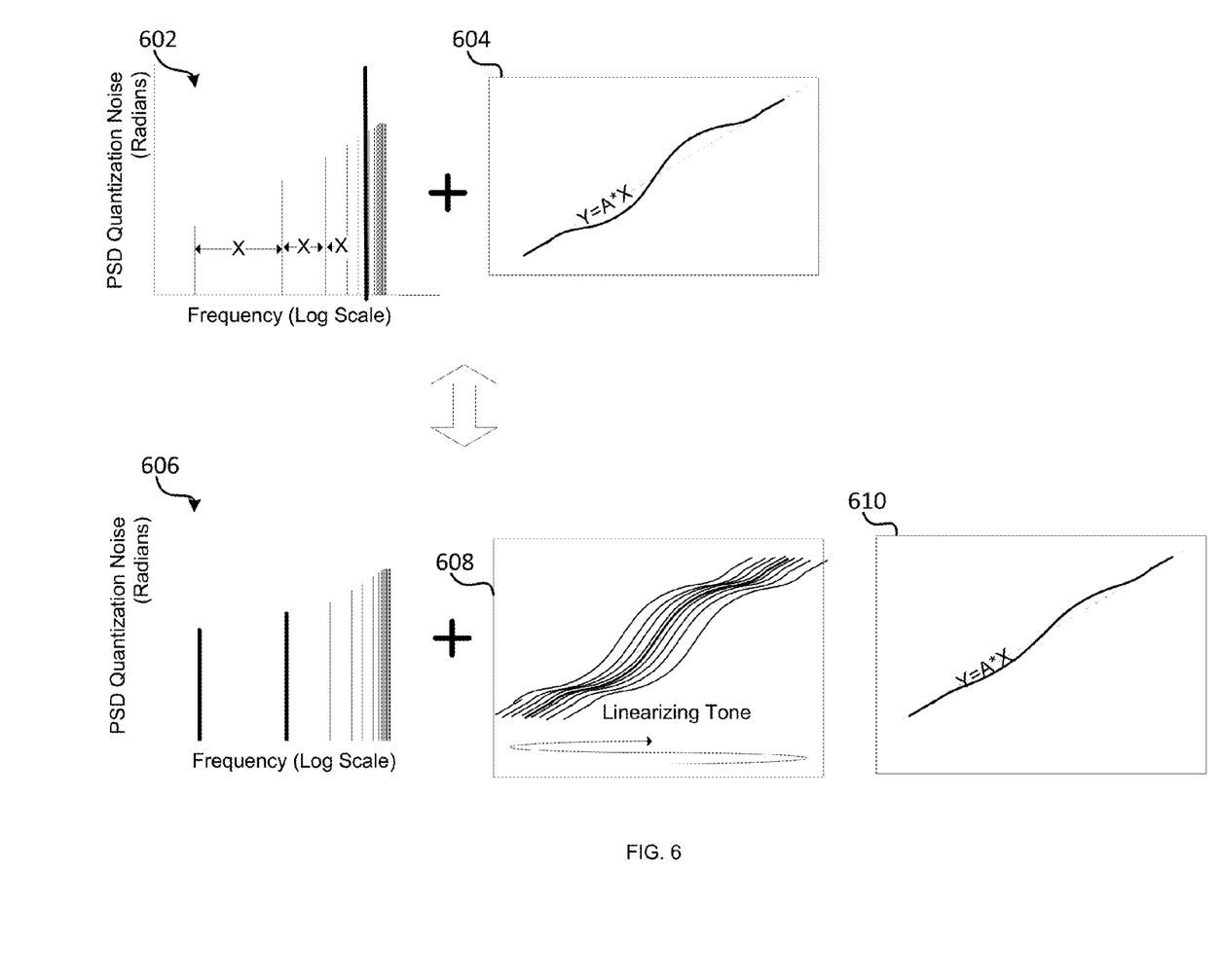
FIG. 6 is a graph of transfer functions and quantization noise after the method of FIG. 5.

FIG. 6 illustrates graphs of quantization noise 602, 606 and transfer functions 604, 608, 610. The quantization noise 602 is added to the single non-linear phase frequency detector (PFD) charge pump gain function 604.

The linearizing tones 608 are added to the PSD quantization noise 606. The plurality of linearizing tones 608 may be considered to be modulating the zero phase position of the transfer characteristic. A combination of the linearizing tones 608 and the power spectral density (PSD) quantization noise 606 produces a linearized transfer characteristic time-averaged over time scales similar to the PLL low pass time constant (Y=A*X).

A linearization single-tone phase modulation signal is represented as a modulation of a phase detection and charge pump phase axis. The phase modulation is a single high frequency signal at a frequency that is significantly unrelated to the frequencies that make up the fractional-N phase modulation sequence. For the case where the linearization signal is a single tone, it can be conceptually seen as a high speed modulation of the phase axis of a nonlinear phase detection and charge pump circuit's transfer characteristic.

In an embodiment, the tonal phase modulation frequency is selected such that it is significantly unrelated to the fractional-N phase modulation frequency. For example, where the fractional-N phase modulation frequency is N/100, a linearization tone having a frequency of 1/4 would not be unrelated as the linearizing tone is a rational ratio of the reference frequency (e.g. divisible evenly into the fractional-N phase modulation frequency).

In an embodiment, the tonal phase modulation frequency is represented as N/M and the reference frequency is represented as A/B. The value of N/M is high with respect to the PLL filter bandwidth. For example the value of N/M is at least 10 times the PLL filter bandwidth. In an embodiment, either or both of N and M are prime numbers. In an embodiment, M is not a divisor of B, such that M does not divide equally into the integer B. For example, where N=3, M=7, A=1, and B=1024, the linearizing tone of 3/7 is significantly unrelated to the reference frequency of 1/1024.

If the linearization tone is thought of as modulating the phase axis of the nonlinear PLL circuit transfer function (from the perspective of the quantization noise phase modulation sequence created by the DSM activity), then the sharp disturbances near zero offset are smoothed out, or equivalently made more linear, through this phase axis modulation activity as shown at 610.

Figure 7:
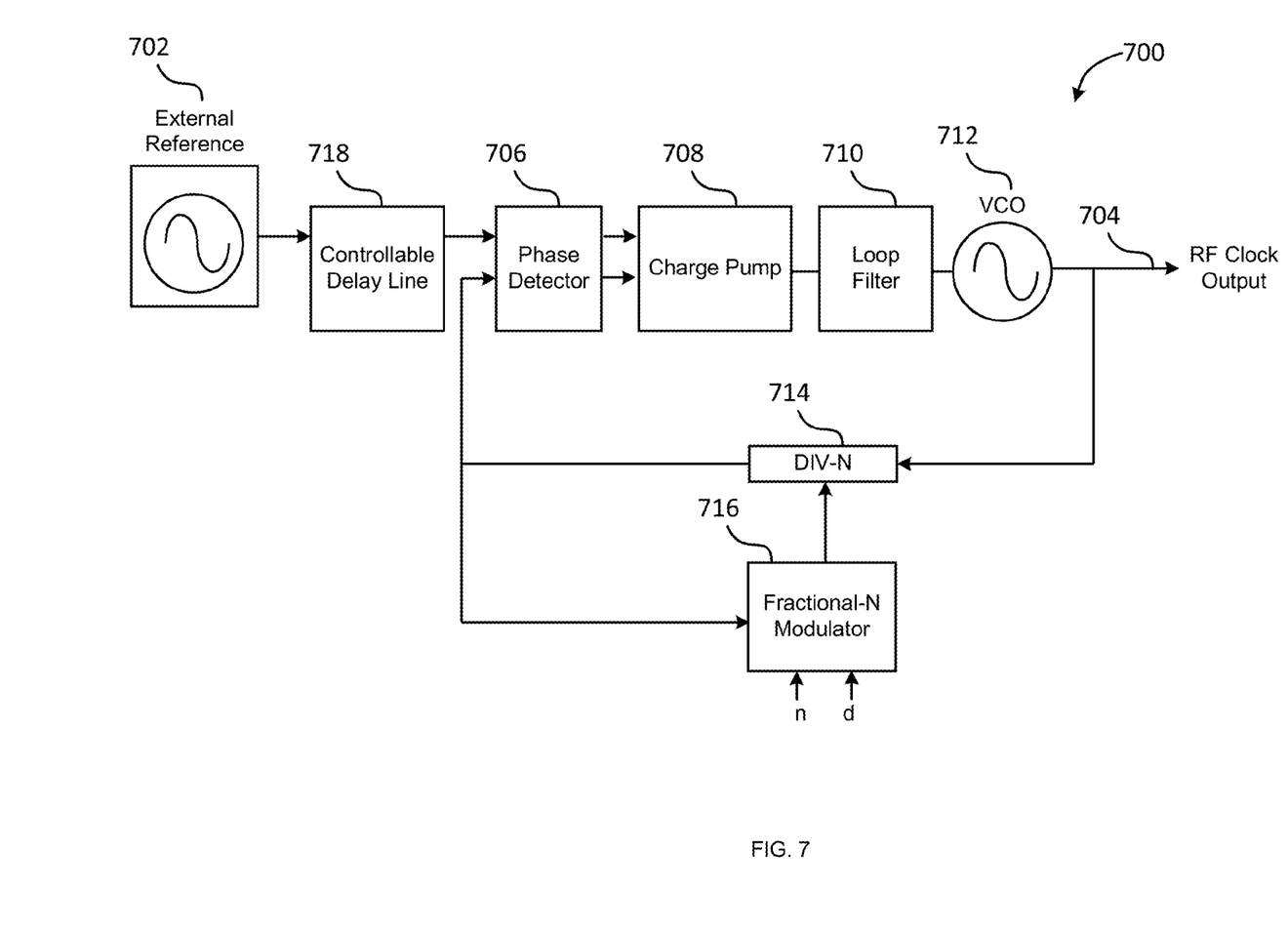
FIG. 7 is a block diagram of a system for reducing spectral pollution, in accordance with a first embodiment.

Turning to FIG. 7, a system 700 including a fractional-N PLL for reducing spurious content, in accordance with an embodiment, is shown. The system 700 includes fractional-N PLL components (phase detector 706, charge pump 708, loop filter 710, a controlled oscillator 712, a multi-modulus divider DIV-N 714), a fractional-N modulator 716, and a controllable delay line 718. The dynamically adjustable delay line 718 is inserted in the reference clock 702 path and its control is modulated at the desired linearization tone frequency to produce the output signal 704 from the input signal 702.

Figure 8:
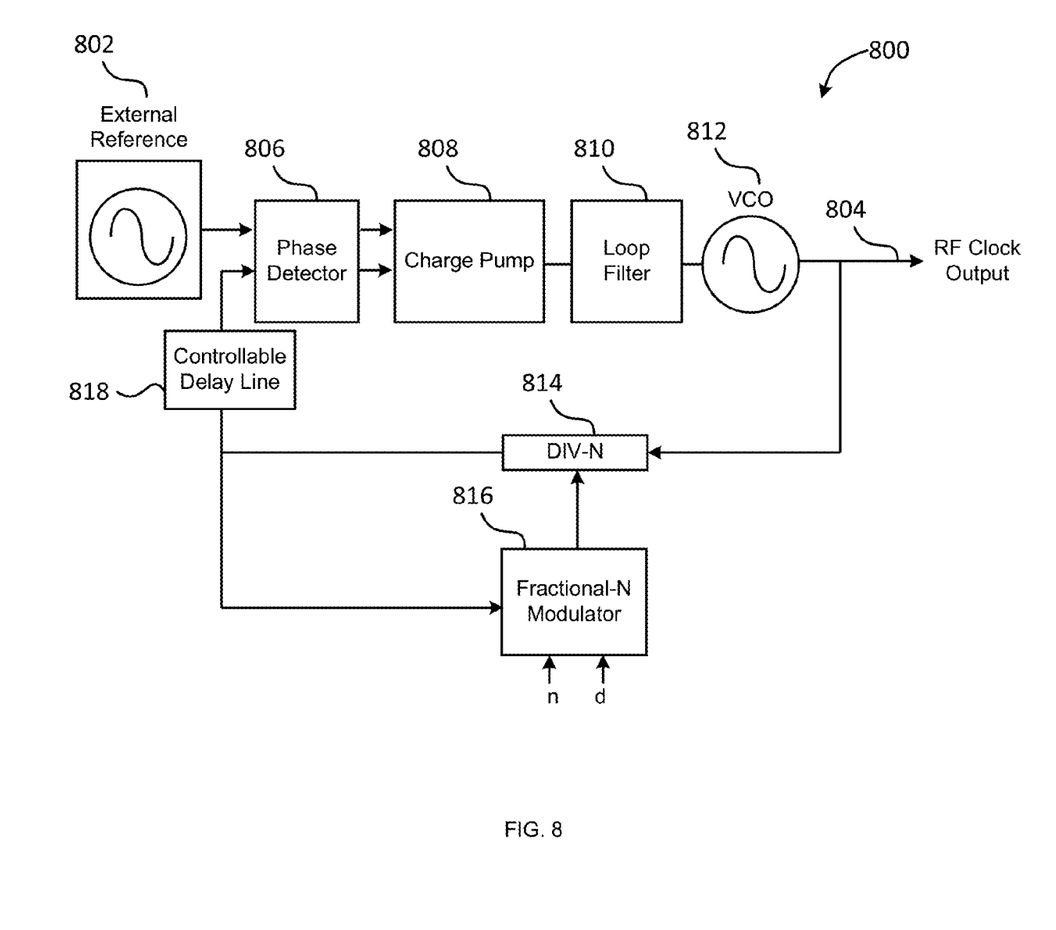
FIG. 8 is a block diagram of a system for reducing spectral pollution, in accordance with a second embodiment.

Turning to FIG. 8, a system 800 including a fractional-N PLL for reducing spurious content, in accordance with an embodiment, is shown. The system 800 includes fractional-N PLL components (phase detector 806, charge pump 808, loop filter 810, a controlled oscillator 812, a multi-modulus divider DIV-N 814), a fractional-N modulator 816, and a controllable delay line 818. The dynamically adjustable delay line 818 is inserted in the feedback clock path and its control is modulated at the desired linearization tone frequency to produce the output signal 804 from the input signal 802.

In an embodiment, the delay line 718, 818 is a modulated analog delay or a modulated digital delay.

The linearization phase modulation signal may be implemented using a range of strategies. In an embodiment, a fractional-N multi-modulus divider is employed as the linearization tone generator. The feedback clock divider that is used in a typical fractional-N PLL, which is a multi-modulus divider, is controlled to effectively act as a controllable delay line. In an embodiment, the multi-modulus divider produces phase modulation tones that have unrelated frequencies to the fractional-N quantization noise repetition frequency.

In an embodiment, the multi-modulus divider provides phase modulation by adding a control sequence to the divider that produces a desired linearization phase modulation signal. This signal is added on top of the fractional-N control signals. A simple implementation accepts that the linearization signal implements in phase steps that have the same resolution of the multi-modulus divider output phase step.

Figure 9:
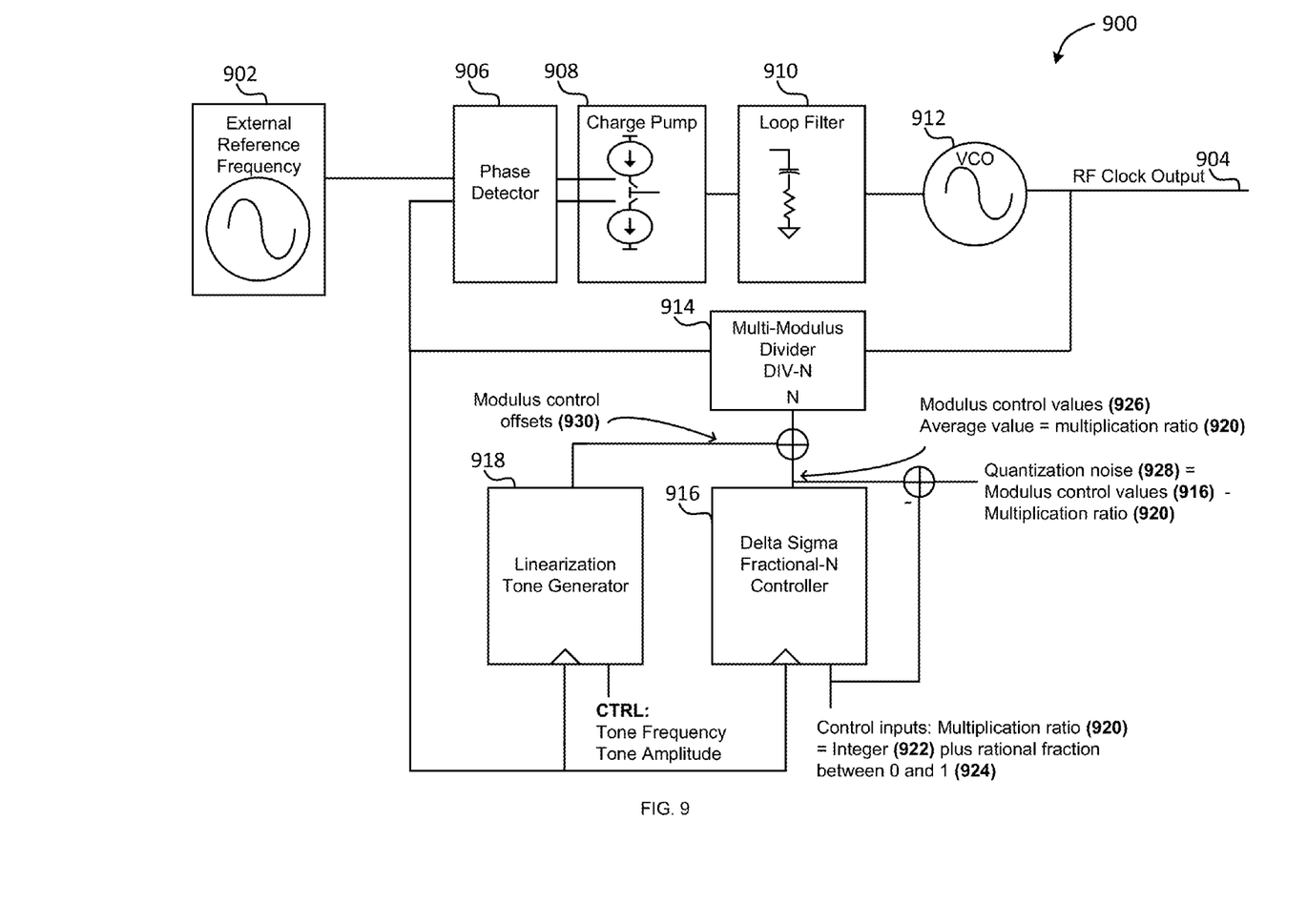
FIG. 9 is a block diagram of a system for reducing spectral pollution, in accordance with a third embodiment.

Turning to FIG. 9, a system 900 including a fractional-N PLL for reducing spurious content, in accordance with an embodiment, is shown. The system 900 includes fractional-N PLL components (phase detector 906, charge pump 908, loop filter 910, a controlled oscillator 912, a multi-modulus divider DIV-N 914), a third order delta sigma modulator (DSM) 916, and a linearization phase linearization tone generator 918.

A fractional-N multiplication coefficient 920 consists of a whole-number term 922 and a rational fraction value 924. The purpose of the fractional-N PLL system 900 is to multiply a reference clock frequency 902 by the fractional-N multiplication coefficient 920 to generate an RF output clock 904. The fractional-N multiplication coefficient 920 is used by the DSM 916 to generate a series of integer-value multi-modulus control signals 926. The average value of the multi-modulus control signals is the fractional-N multiplication coefficient 920.

Quantization noise 928 is the difference between the fractional-N multiplication coefficient 920 and the multi-modulus control signals 926. Quantization noise 928 has a repetitive characteristic that depends on the DSM 916. Where the DSM 916 is a first order DSM, the quantization noise 928 is repetitive with a frequency equal to the product of the rational fraction 924 and the reference clock frequency 902. Because it is repetitive at this frequency, the quantization noise 928 is made up of frequency content equal to this repetition frequency and its harmonics.

The additional phase modulation tone generator 918 generates a stream of integer-value multi-modulus control signal offsets 930. In an embodiment, the average value of this sequence is 0. The repetition frequency and signal content of this sequence is chosen such that it includes no significant power below or near the PLL bandwidth. The repetition frequency is chosen such that it is unrelated to the repetition frequency of the quantization noise.

In an embodiment, the linearization tone signal 930 will repeat with some number of clock cycles and the quantization noise 928 will repeat at some number of clock cycles, so they will have some relationship. In an embodiment, repetition occurs after a very large number of cycles with respect to the degree of unrelatedness. The tone frequency (or frequencies) of the linearization signal 930 is selected based on a frequency that is significantly attenuated by the PLL. For example, where the frequency is 1/1024 and the linearizing tone is selected as 3/7 repetition would occur every 3*7*1024 cycles. In this example there is an unrelatedness value of 21 (3*7) times the frequency. In an embodiment, the linearizing tone is selected such that the unrelatedness value is at least ten times greater than the fractional-N frequency value.

In certain embodiments, the linearizing frequency 930 will be selected such that it falls in a region where spectral purity requirements for the RF clock are relaxed (this optimization is particularly relevant to wireless transceiver applications).

Where multiple frequencies 930 are used, the frequencies 930 should be used such that no intermodulation products between the multiple linearization tone frequencies fall at a very low frequency (i.e. below the PLL bandwidth).

The linearizing frequency 930 may be selected such that it is unrelated to the repetition frequency of the fractional-N quantization noise repetition rate.

Implementation of RF clock generation PLLs reduces the level of linearity required in phase detection and charge pump circuits needed to achieve acceptable spurious performance in near-integer multiplier configurations. By using the existing multi-modulus divide-by-N and the existing fractional-N control interface to produce a linearizing phase modulation signal, an additional phase-modulation circuit is avoided which reduces device cost and power consumption. By employing unrelated frequency phase modulation tones to provide linearization, additional intermodulation effects related to the linearization signal content will not produce any significant energy at low frequencies, such that mitigating intermodulation spurious content in fractional-N PLLs produces minimal side effects.

Figure 10:
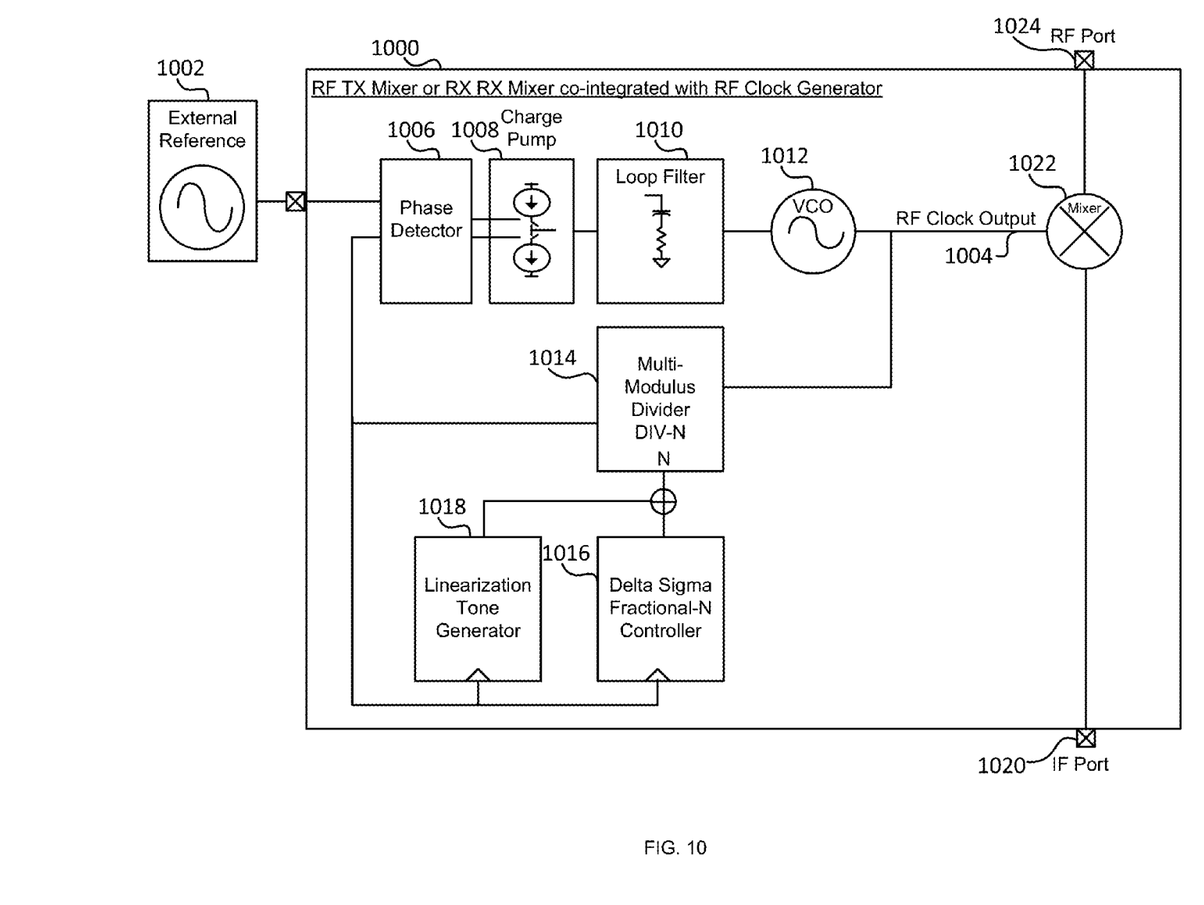
FIG. 10 is a block diagram of a system for reducing spectral pollution, in accordance with a fourth embodiment.

Turning to FIG. 10 a radio frequency (RF) Transmit or Receive mixer device 1000 co-integrated with a Fractional-N RF clock generator (for example, as described with reference to FIG. 9), in accordance with an embodiment, is shown. The device 1000 includes fractional-N PLL components (phase detector 1006, charge pump 1008, loop filter 1010, a controlled oscillator 1012, a multi-modulus divider DIV-N 1014), a delta sigma modulator (DSM) 1016, and a linearization phase linearization tone generator 1018.

A reference signal 1002 is multiplied by the fractional-N multiplication coefficient to generate an RF output signal 1004. The output signal 1004 is mixed with a signal from an intermediate frequency port 1020 by the mixer 1022 for output to a RF port 1024.

The fractional-N PLL spur mitigation systems described and illustrated herein may be employed in any system that requires a high level of spectral purity on output clocks across a wide range of output clock frequencies.

Conventional alternatives to these systems may require significant integrated circuit area and design and analysis complexity to improve linearity of critical circuits. Conventional alternatives may introduce additional noise in the case of leakage currents to introduce static phase offset. Conventional alternatives that whiten quantization noise from a DSM through randomization with the intermodulation products not falling in a single tone may produce significant intermodulation power at lower frequencies from the non-linearity experienced by the whitened quantization noise signal. Not solving this problem by avoiding problematic PLL output frequencies may either reduce system application space (because the system is not capable of supporting a portion of the needed applications) or add to system cost and complexity (in the scenario where additional frequency flexibility is implemented in other areas, for example in a super heterodyne RF transceiver implementing additional flexibility of the intermediate frequency (IF) where the signal is centered to allow for inflexibility in the RF frequency in these configurations).

Embodiments of the present disclosure provide for more competitive devices both in the wireless RF clock generator space and in other fractional-N clock generation applications where clock output flexibility and stringent spectral purity requirements may be required.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A system comprising:
   a fractional-N phase locked loop (PLL) for frequency multiplying an input signal by a multiplication factor to generate an output signal, the fractional-N PLL comprising an input signal path and a feedback signal path; and
   a dynamically adjustable delay line controllable by a linearizing phase modulation signal for inserting a linearizing tone into the input signal path or the feedback signal path of the fractional-N PLL to suppress spurious spectral content generated by a non-linearity in a phase detector and charge pump of the fractional-N PLL.

2. The system of claim 1, wherein a frequency of the linearizing tone is unrelated to a quantization noise repetition frequency of the fractional-N PLL.

3. The system of claim 1, wherein the fractional-N PLL comprises a phase detector and a charge pump, and wherein the linearizing tone is selected such that a phase detector and charge pump transfer function of the fractional-N PLL is linearized over a time scale near or below an inherent low pass time constant of the fractional-N PLL.

4. The system of claim 1, wherein the linearizing tone comprises a signal having a frequency at least ten times a bandwidth of the fractional-N PLL.

5. The system of claim 1, wherein the linearizing tone comprises a plurality of tonal phase modulation signals and wherein each of the plurality of tonal phase modulation signals has a unique frequency.

6. The system of claim 5, wherein the plurality of tonal phase modulation signals avoid intermodulation below a low pass bandwidth of the fractional-N PLL.

7. The system of claim 3, wherein a frequency and amplitude of the linearizing tone is optimized for a fraction value of the fractional-N PLL.

8. The system of claim 1, wherein the linearizing phase modulation signal is generated by a multi-modulus divider in the feedback signal path of the fractional-N PLL.

9. The system of claim 8, wherein the multi-modulus divider produces the linearizing tone, and wherein the linearizing tone is superimposed on an underlying fractional-N phase modulation signal of the fractional-N PLL.

10. The system of claim 1, wherein the linearizing phase modulation signal is a modulated analog delay signal or a modulated digital delay signal.

11. The system of claim 1, wherein the linearizing tone comprises a simple tone with a frequency equal to half of a frequency of the input signal.

12. The system of claim 1, wherein the linearizing tone comprises equal magnitude positive and negative phase offsets for alternating input signal cycles.

13. A method comprising:
frequency multiplying, using a fractional-N phase locked loop (PLL), an input signal by a multiplication factor to generate an output signal, the fractional-N PLL comprising an input signal path and a feedback signal path; and
inserting a linearizing tone into the input signal path or the feedback signal path of the fractional-N PLL using a dynamically adjustable delay line controllable by a linearizing phase modulation signal to suppress spurious spectral content generated by a non-linearity in a phase detector and charge pump of the fractional-N PLL.

14. The method of claim 13, wherein a frequency of the linearizing tone is unrelated to a quantization noise repetition frequency of the fractional-N PLL.

15. The method of claim 13, wherein the fractional-N PLL comprises a phase detector and a charge pump, and wherein the method further comprises selecting the linearizing tone such that a phase detector and charge pump transfer function of the fractional-N PLL is linearized over a time scale near or below an inherent low pass time constant of the fractional-N PLL.

16. The method of claim 13, wherein the linearizing tone comprises a signal having a frequency at least ten times a bandwidth of the fractional-N PLL.

17. The method of claim 13, wherein the linearizing tone comprises a plurality of tonal phase modulation signals and wherein each of the plurality of tonal phase modulation signals has a unique frequency.

18. The method of claim 17, wherein the plurality of tonal phase modulation signals avoid intermodulation below a low pass bandwidth of the fractional-N PLL.

19. The method of claim 15 further comprising:
optimizing a frequency and amplitude of the linearizing tone for a fraction value of the fractional-N PLL.

20. The method of claim 13 further comprising:
generating the linearizing phase modulation signal using a multi-modulus divider in the feedback signal path of the fractional-N PLL.

21. The method of claim 20 further comprising:
superimposing the linearizing tone on an underlying fractional-N phase modulation signal of the fractional-N PLL.

22. The method of claim 13 wherein:
the linearizing phase modulation signal is a modulated analog delay signal or a modulated digital delay signal.

23. The method of claim 13, wherein the linearizing tone comprises a simple tone with a frequency equal to half of a frequency of the input signal.

24. The method of claim 13, wherein the linearizing tone comprises equal magnitude positive and negative phase offsets for alternating input signal cycles.

* * * * *